(12) United States Patent
Holmes et al.

(10) Patent No.: US 6,506,660 B2
(45) Date of Patent: Jan. 14, 2003

(54) SEMICONDUCTOR WITH NANOSCALE FEATURES

(75) Inventors: Steven J. Holmes, Milton, VT (US); Charles Black, White Plains, NY (US); David J. Frank, Yorktown Heights, NY (US); Toshiharu Furukawa, Essex Junction, VT (US); Mark C. Hakey, Franklin, VT (US); David V. Horak, Essex Junction, VT (US); William Hsioh-Lien Ma, Fishkill, NY (US); Keith R. Milkove, Beacon, NY (US); Kathryn W. Guarini, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/008,092

(22) Filed: Nov. 13, 2001

(65) Prior Publication Data

US 2002/0058394 A1 May 16, 2002

Related U.S. Application Data

(62) Division of application No. 09/713,766, filed on Nov. 15, 2000, now Pat. No. 6,358,813.

(51) Int. Cl.[7] .............................................. H01L 21/20
(52) U.S. Cl. ...................... 438/398; 438/691; 438/700
(58) Field of Search ............................... 438/398, 691, 438/700, 735; 216/2, 44, 52, 53

(56) References Cited

U.S. PATENT DOCUMENTS

| | | | |
|---|---|---|---|
| 5,757,612 A | | 5/1998 | Acosta et al. ............. 361/321.4 |
| 5,772,905 A | * | 6/1998 | Chou .......................... 216/44 |
| 5,922,214 A | * | 7/1999 | Liu et al. ...................... 216/2 |

OTHER PUBLICATIONS

T.L. Morkved, P. Wiltzius, H.M. Jaeger, D.G. Grier, and T.A. Witten; "Mesoscopic Self–Assembly of Gold Islands on Diblock–Copolymer Films," Applied Physics Letter vol. 64, No. 4, Jan. 24, 1994; pp. 422–424.

P. Mansky, P. Chaikin, and E. L. Thomas; "Monolayer Films of Diblock Copolymer Microdomains for Nanolithographic Applications," Journal of Material Science, vol. 30, No. 8, Apr. 15, 1995; pp. 1987–1992.

Z. Ki, W. Zhao, Y. Liu, M. H. Rafailovich, and J. Sokolov; "Self–Ordering of Diblock Copolymers from Solution," Journal of the American Chemical Society, vol. 118, No. 44, Nov. 6, 1996; pp. 10892–10893.

(List continued on next page.)

Primary Examiner—Chandra Chaudhari
Assistant Examiner—Yennhu B. Huynh
(74) Attorney, Agent, or Firm—Mark F. Chadurjian; Cantor Colburn LLP

(57) ABSTRACT

Described is a method of increasing the capacitance of semiconductor capacitors by providing a first solid-state electrode pattern on a semiconductor medium, etching topographic features on said first electrode pattern in a manner effective in increasing the surface area of said first electrode pattern, depositing a dielectric layer upon said electrode pattern that substantially conforms to said topographic features, and depositing a second solid-state electrode pattern upon said dielectric layer and sufficiently insulated from said first solid-state electrode pattern so as to create a capacitance with said first solid-state electrode pattern.

18 Claims, 16 Drawing Sheets

OTHER PUBLICATIONS

Hiroshi Ikeda, Michiei Nakamura, Nobuyuki Ise, Naomi Oguma, Asao Nakamura, Tuskasa Ideda, Fujio Toda, and Akihiko Ueno; "Fluorescent Cyclodextrins for Molecule Sensing: Fluorescent Properties, NMR Characterization, and Inclusion Phenoma of N–Dansylleucine–Modified Cyclodextrins," Journal of the American Chemical Society, vol. 118, No. 45, Nov. 13, 1996; p. 10982.

P. Mansky, C.K. Harrison, and P.M. Chakin; "Nanolithographic Templates from Diblock Copolymers Thin Films," Applied Physics Letters, vol. 68, No. 18, Apr. 29, 1996, pp. 2586–2588.

T. L. Morkved, M. Lu, A.M. Urbas, E.E. Ehrichs, H.M. Jaeger, P. Mansky, and T.P. Russel; "Local Control of Microdomain Orientation in Diblock Copolymer Thin Films with Electric Fields," Science, vol. 273, No. 5277, Aug. 16, 1996; pp. 931–933.

Miri Park, Christopher Harrison, Paul M. Chaikin, Richard A. Register, and Douglas H. Adamson; "Block Copolymer Lithography: Periodic Arrays of ~ 10 11 Holes in 1 Square Centimeter," Science, vol. 276, No. 5317, May 30, 1997; pp. 1401–1404.

* cited by examiner

SEMICONDUCTOR WITH NANOSCALE FEATURES

This is a divisional of Ser. No. 09/713,766, filed Nov. 15, 2000, now U.S. Pat. No. 6,358,813.

FIELD OF THE INVENTION

This invention relates to improved semiconductor capacitors that are particularly useful for manufacturing improved dynamic random access memory (DRAM), among other semiconductor devices.

BACKGROUND OF THE INVENTION

Dynamic random access memory (DRAM) is well known in the art, the first commercially available DRAM having been the Intel 1103, introduced to the market in 1970. In a typical DRAM, information is stored in semiconductor capacitors on a metal oxide semiconductor (MOS) integrated circuit. Each semiconductor capacitor has a transistor associated with it, such that each transistor/capacitor combination forms a storage cell, or node, that can hold a single bit of information. Unfortunately, the capacitors leak so the storage nodes must be refreshed periodically. As these devices are scaled down to increasingly smaller sizes, the capacitance of the storage nodes is a limitation. There is a need for a method of increasing the capacitance of such storage nodes while also making them smaller.

BRIEF SUMMARY OF THE INVENTION

Described is a method of increasing the topography of a semiconductor capacitor such as to effectively increase the capacitance of the capacitor without increasing the size of the capacitor. This is achieved by superimposing a topography, such as an array of holes or islands, onto the electrodes of the capacitor, wherein the elements of the topography (i.e., the holes or islands) are generally about an order of magnitude smaller than the capacitor itself.

DETAILED DESCRIPTION OF THE INVENTION

Described is a method of increasing the topography of a semiconductor capacitor such as to effectively increase the capacitance of the capacitor without increasing the size of the capacitor, or even shrinking the size of the capacitor. This is achieved by superimposing a topography, such as an array of holes or islands, onto the electrodes of the capacitor, wherein the elements of the topography (i.e., the holes or islands) are generally about an order of magnitude smaller than the capacitor itself, give or take half a magnitude. By increasing the surface area of the electrodes, the capacitance of the capacitor is greatly increased without taking up valuable additional space on the semiconductor substrate.

The invention is suited to storage media, such as dynamic random access memory (DRAM), that rely on capacitors to store bits of information. Such devices typically comprise storage nodes, or cells, that comprise a transistor associated with a capacitor. The capacitors leak and therefore need to be refreshed. As semiconductors are scaled smaller, it becomes a critical need to maintain capacitance even though the capacitors must necessarily be smaller, otherwise the leakage will result in requiring ever more frequent refresh cycles, thereby degrading system performance.

The invention may also be used for other capacitor applications, such as decoupling capacitors.

Figure 1:
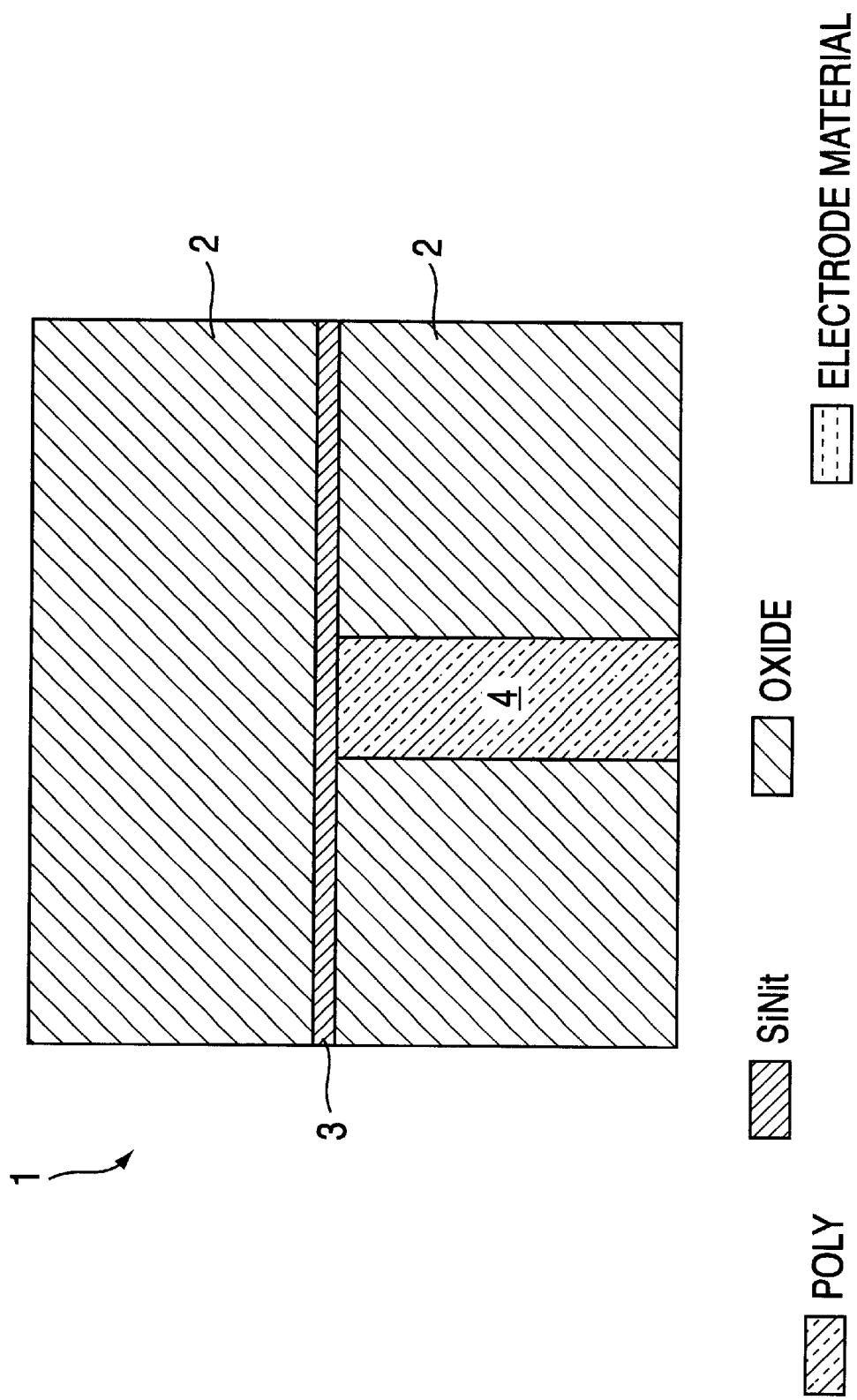
FIG. 1 is a cross-sectional view of a semiconductor substrate ready to receive a capacitor pattern.

Referring to FIG. 1, there is shown in cross-section a film stack 1 atop a semiconductor substrate (not shown), usually in the form of a wafer or "chip", ready to have a capacitor etched upon it. The film stack 1 at this point comprises two layers of oxide 2 separated by a thin etch stop layer 3 of silicon nitride. A conductive polysilicon structure 4 is positioned to provide electrical contact up from the semiconductor substrate to the capacitor that will subsequently be constructed on top of the film stack 1.

Figure 2:
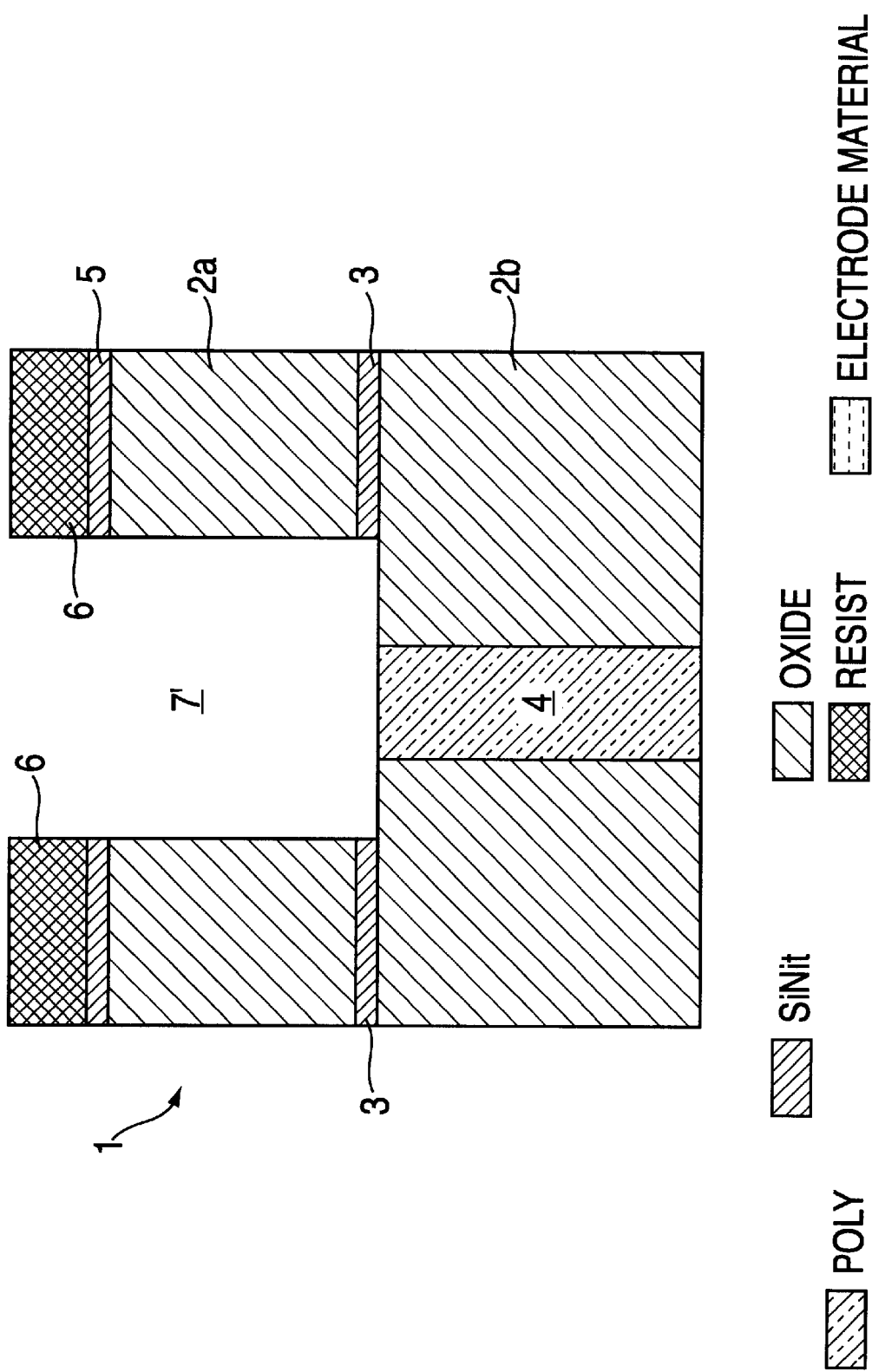
FIG. 2 shows the addition of a silicon nitride polish stop to the pattern of FIG. 1.

Referring to FIG. 2, a polish stop layer 5 of silicon nitride is laid down upon the upper layer 2a of silicon oxide. On top of this polish stop layer 5 is laid a photoresist pattern 6. The photoresist is exposed and developed to produce a cavity 7'. The function of the polish stop is to aid in the planarization of electrode material that will be added in the next step to form a first electrode.

Figure 3:
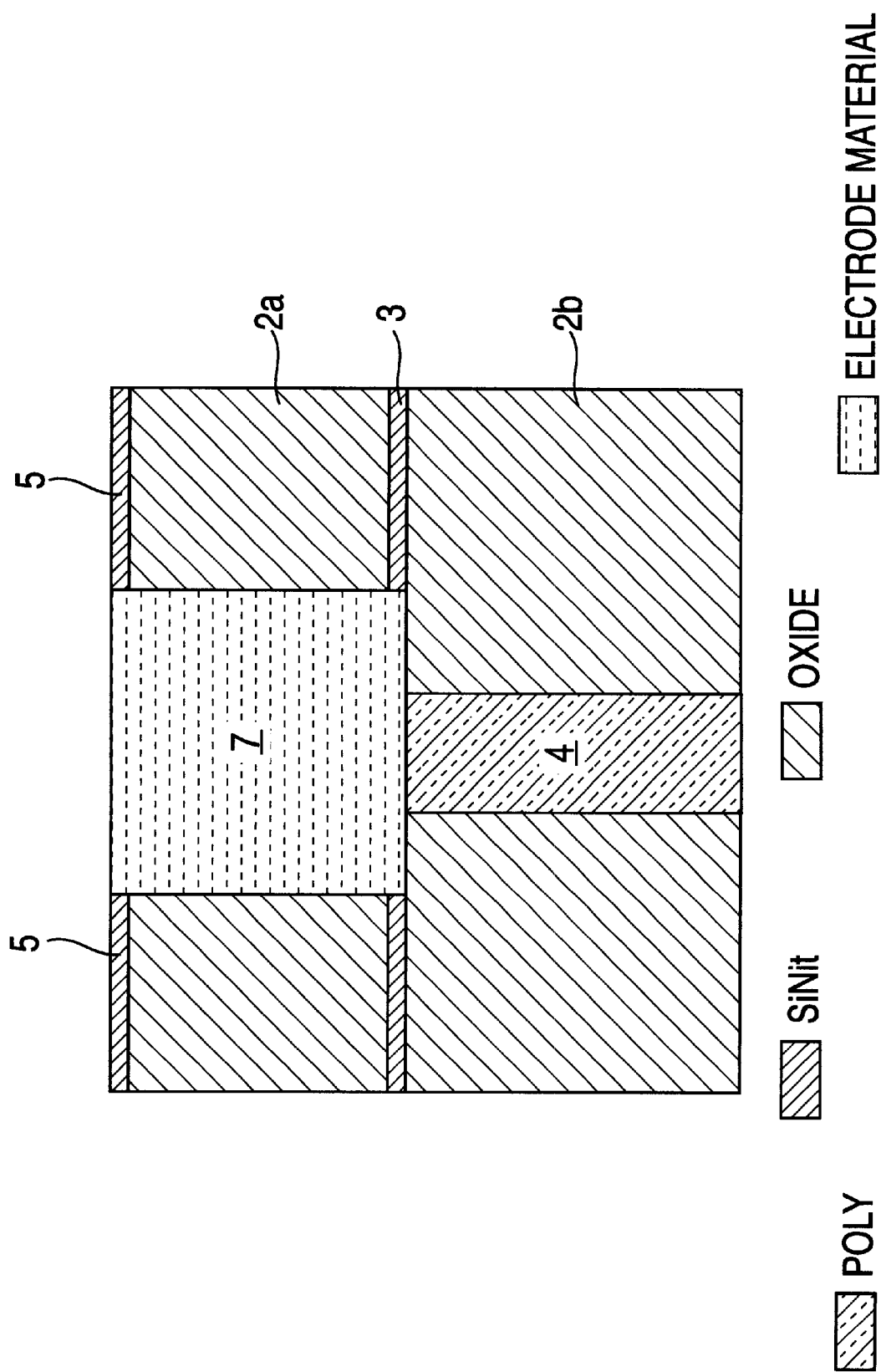
FIG. 3 shows the addition of a first electrode pattern to the pattern of FIG. 2.

Referring to FIG. 3, the cavity is filled in with an electrode material so as to form a first electrode 7 in direct contact with the conductive polysilicon structure 4. The electrode material is usually doped silicon, tungsten, or tungsten silicide. Note that the polish stop layer 5 prevents subsequent operations from diminishing the thickness of the upper oxide layer 2a and the conductive fill 7.

Figure 4:
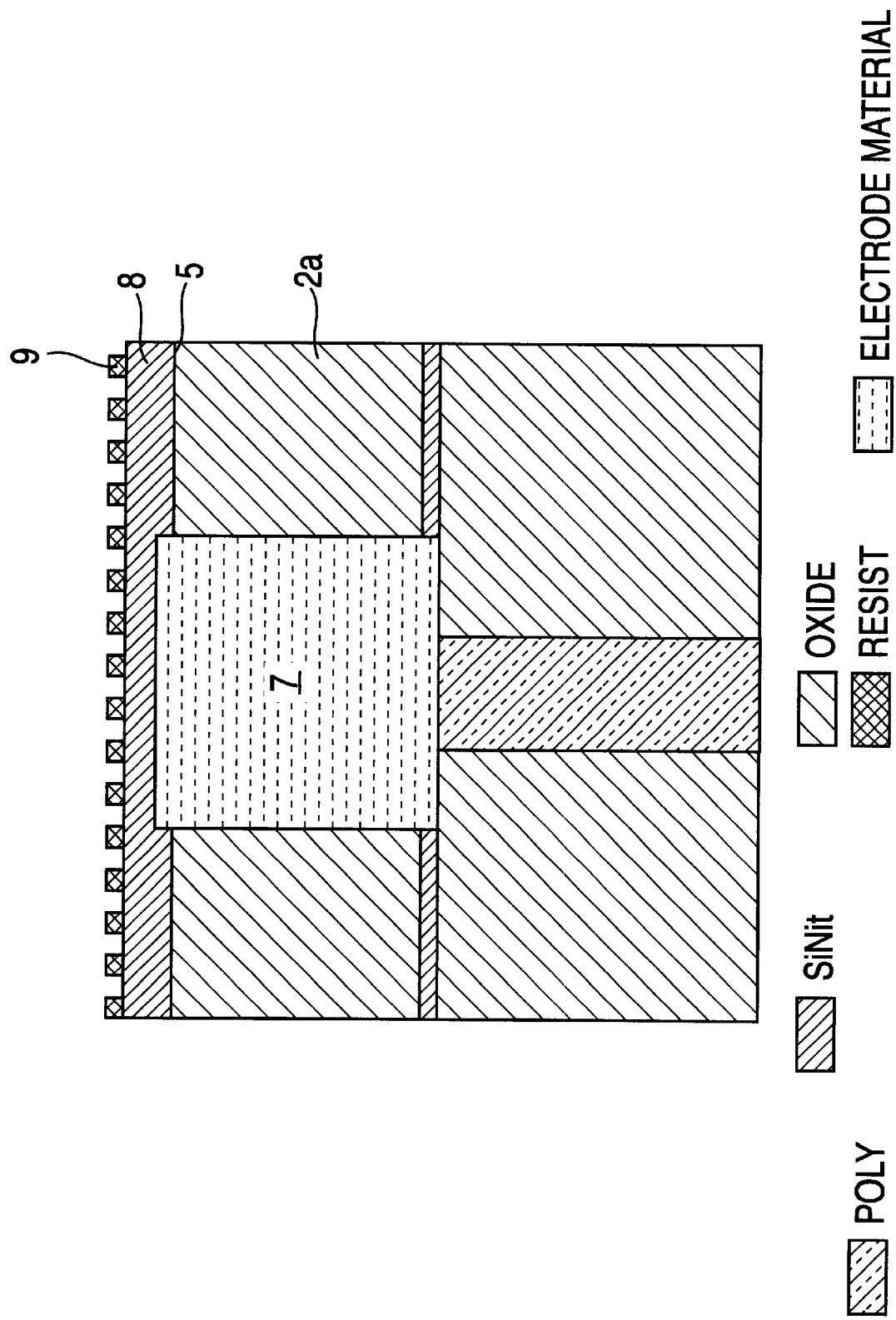
FIG. 4 shows the addition to the pattern of FIG. 3 of a silicon nitride mask with a topographical pattern.

Referring to FIG. 4, a hard mask of silicon nitride 8 is laid down on top of the polish stop 5 and a topographic pattern 9 laid on top of the hard mask 8. The pattern is usually made of a polymer film that is laid down by immersing the wafer 1 in a solution from which the polymer film deposits upon the surface of the wafer. Another method is a solution in which the wafer 1 is first submerged and then carefully withdrawn from the solution upon the surface of which the polymer film floats. When the wafer is lifted out, the polymer film rests upon its upper surface. Other means of providing a topographic pattern are known and described more fully below with respect to FIGS. 10 and 11.

Figure 5:
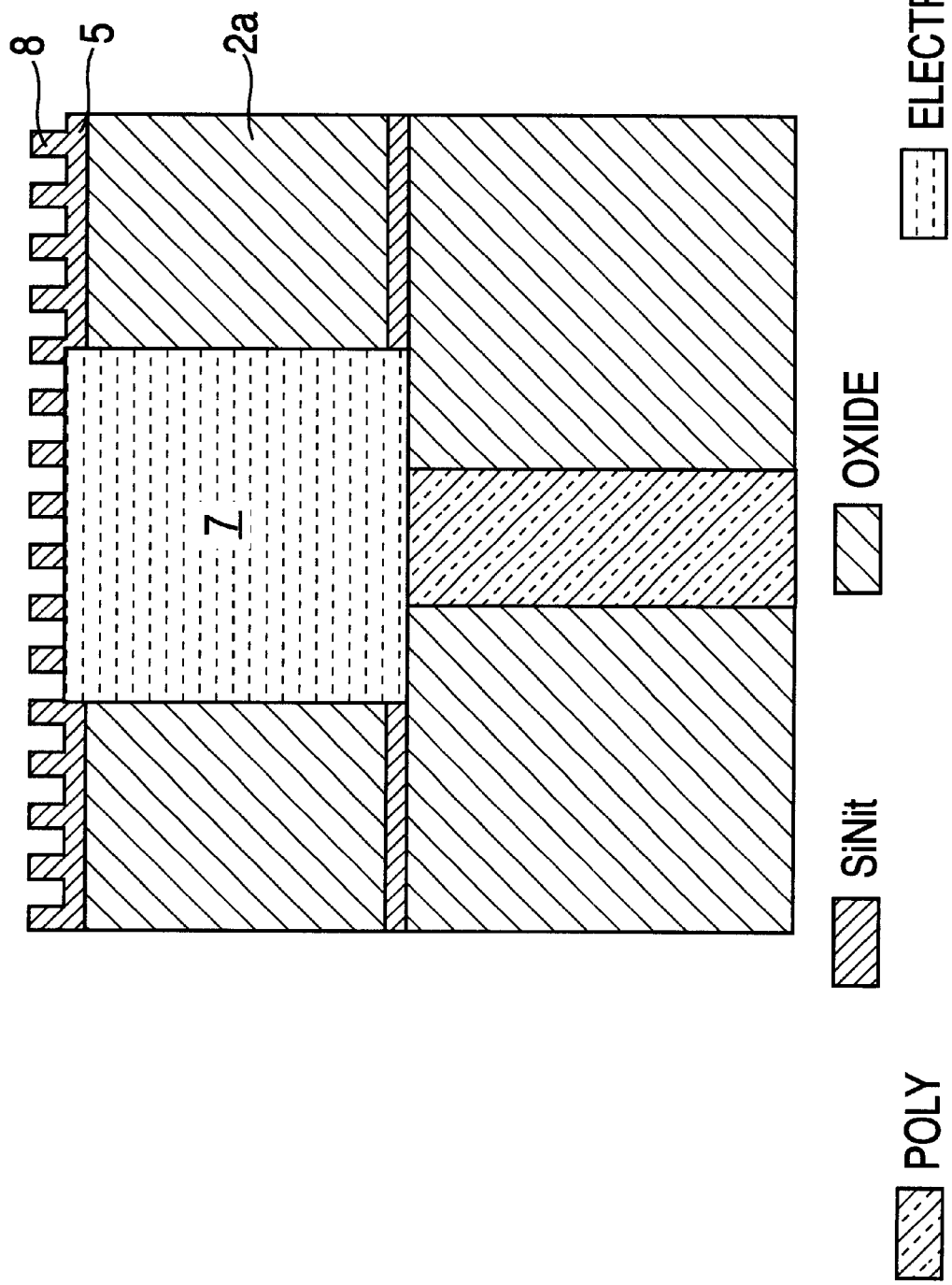
FIG. 5 shows a topographical pattern etched into the silicon nitride mask of FIG. 4.

Referring to FIG. 5, the topographic pattern 9 is etched into the hard mask 8.

Figure 6:
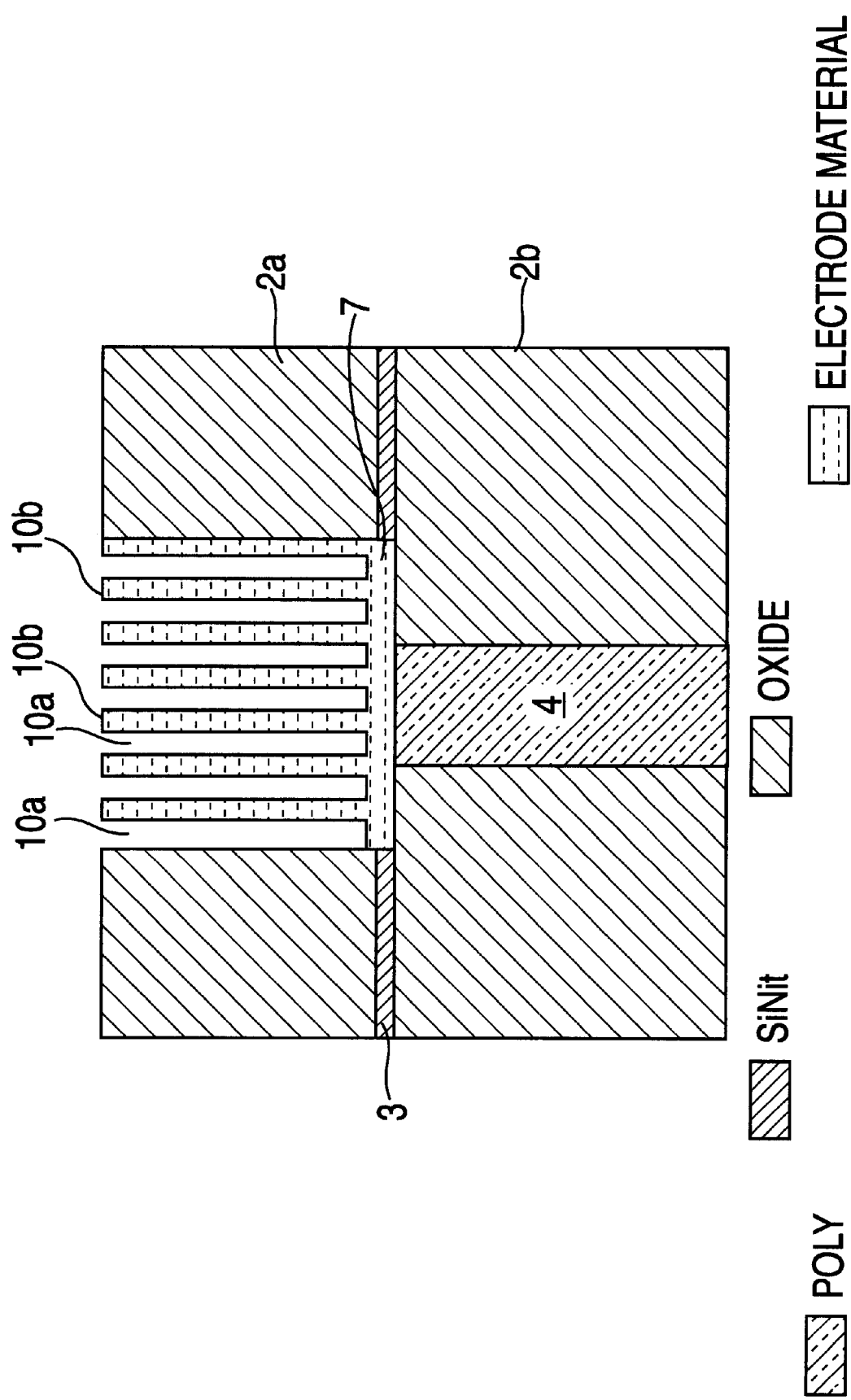
FIG. 6 shows the topographical features etched into the mask of FIG. 5 extended to the underlying first electrode pattern.

Referring to FIG. 6, the pattern etched in the hard mask 8 is then transferred to the electrode 7 by means of Reactive Ion Etch (RIE). RIE is a preferred plasma etch process in which ions and reactive neutral species are created in the plasma. The neutral species react with the wafer surface material thereby forming volatile products. The removal rate of these volatile products are enhanced by the application of electric fields. These fields accelerate the plasma-generated ions toward the wafer, providing them with energy that can break the bonds that bind the product molecules to the wafer surface. Notice that the pattern only etches into the electrode material 7 and has no effect upon the surrounding silicon oxide layer 2a, while very significant topographic features 10 in the nature of depressions 10a and protrusions 10b are formed in the electrode material 7, thereby increasing the effective surface area of the first electrode 7. Note also how the polish stop and hard mask is etched away in the process.

Figure 7:
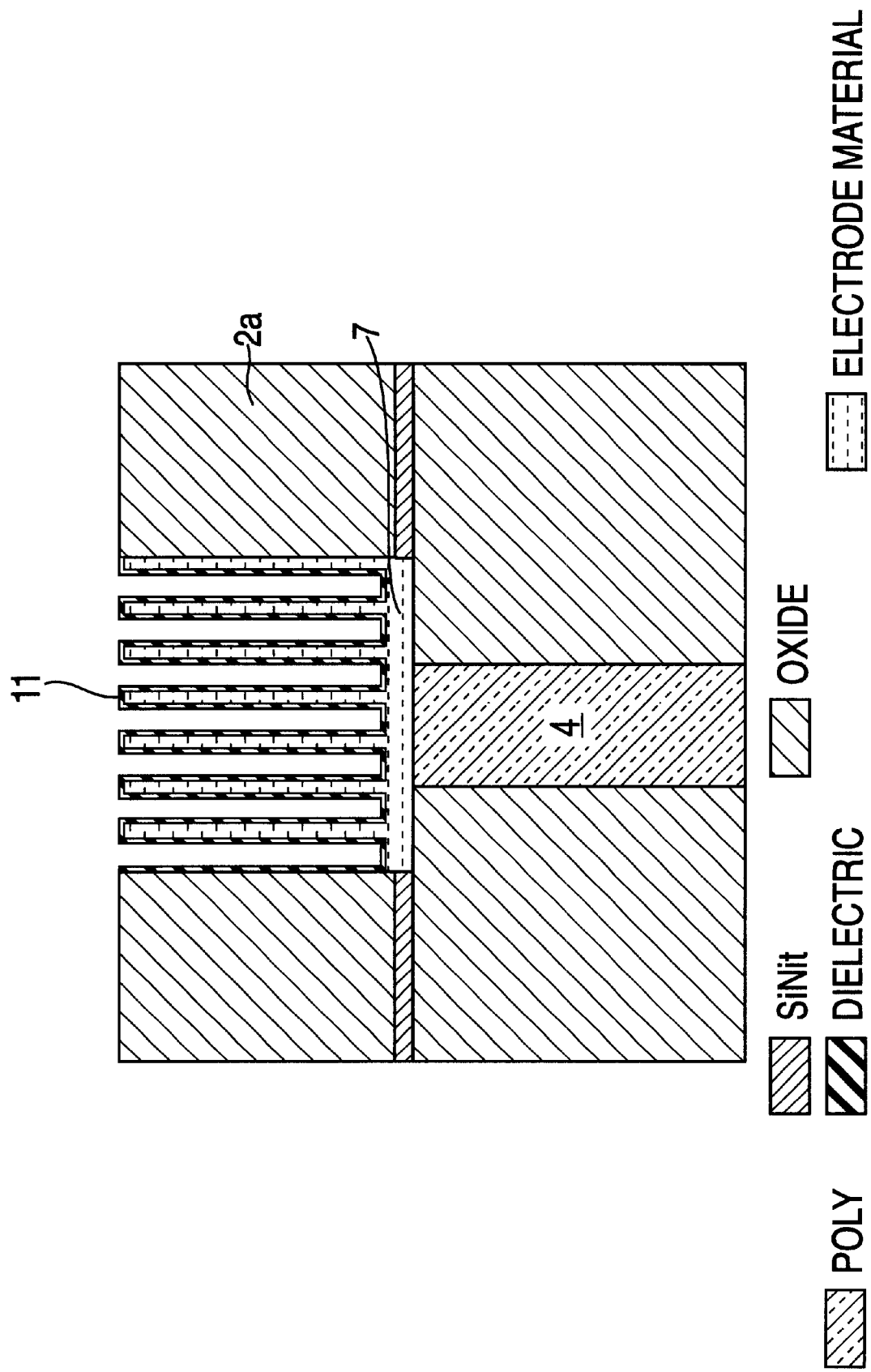
FIG. 7 shows a dielectric layer deposited onto the topographical features of FIG. 6.

Referring to FIG. 7, the next step is to cover the surface area of the first electrode 7 with a dielectric 11. The usual dielectric in the art is a combination of silicon oxides and nitrides, generally delivering a dielectric constant of about 4 to 7. It is preferred, however, that materials with higher dielectric constants be used so as to increase capacitance. "Mid-E" dielectrics such as tantalum oxide, hafnium oxide, zirconium oxide, and titanium oxide are preferred, having dielectric constants ranging from about 15 to about 40. Still more preferable are "High-E" dielectrics, such as derivatives of barium strontium titanates (BSTOs), which will typically have dielectric constants on the order of about 300.

Figure 7B:
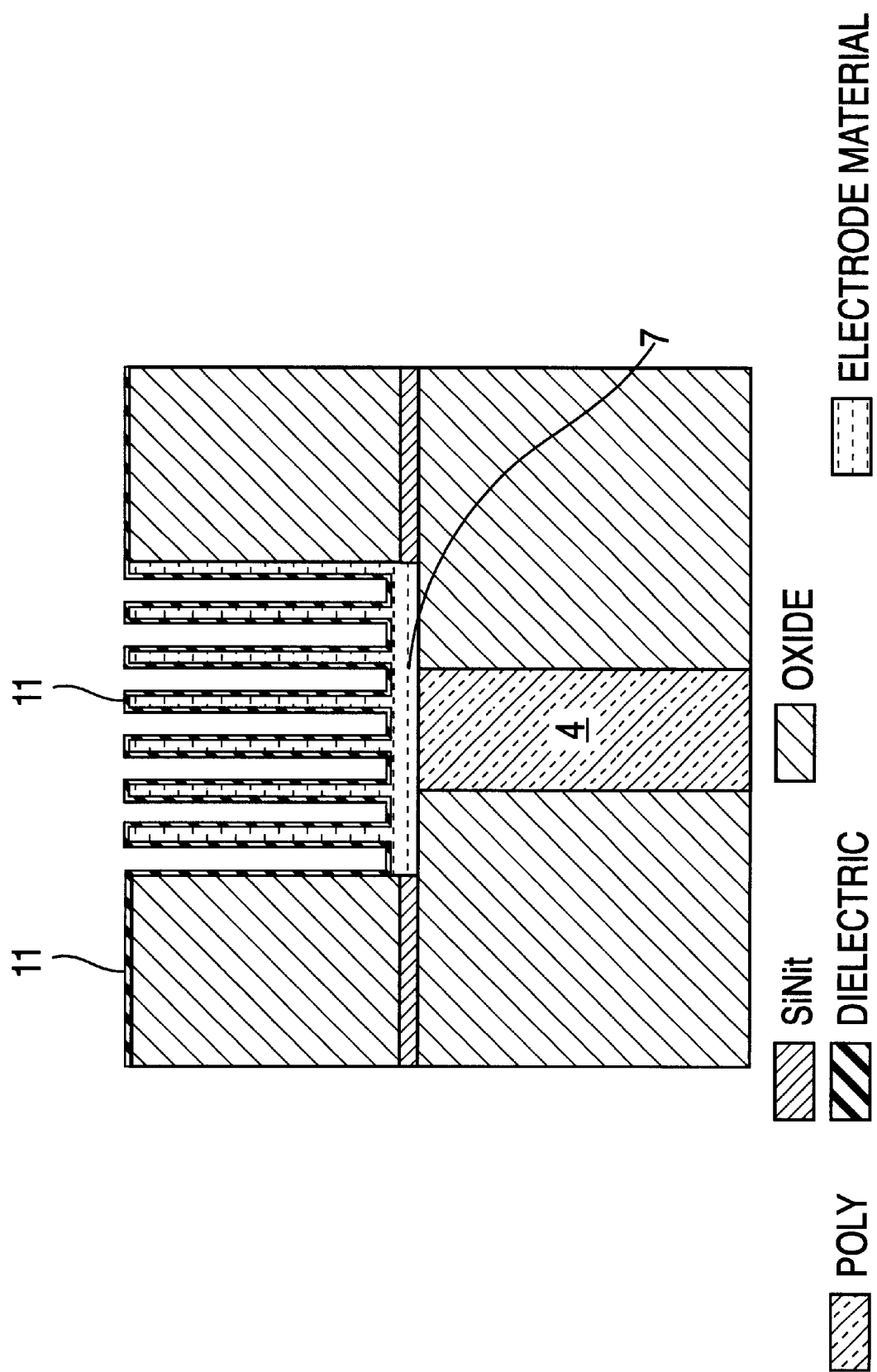
FIG. 7b shows another embodiment of a dielectric layer deposited onto the topographical features of FIG. 6.
Figure 8:
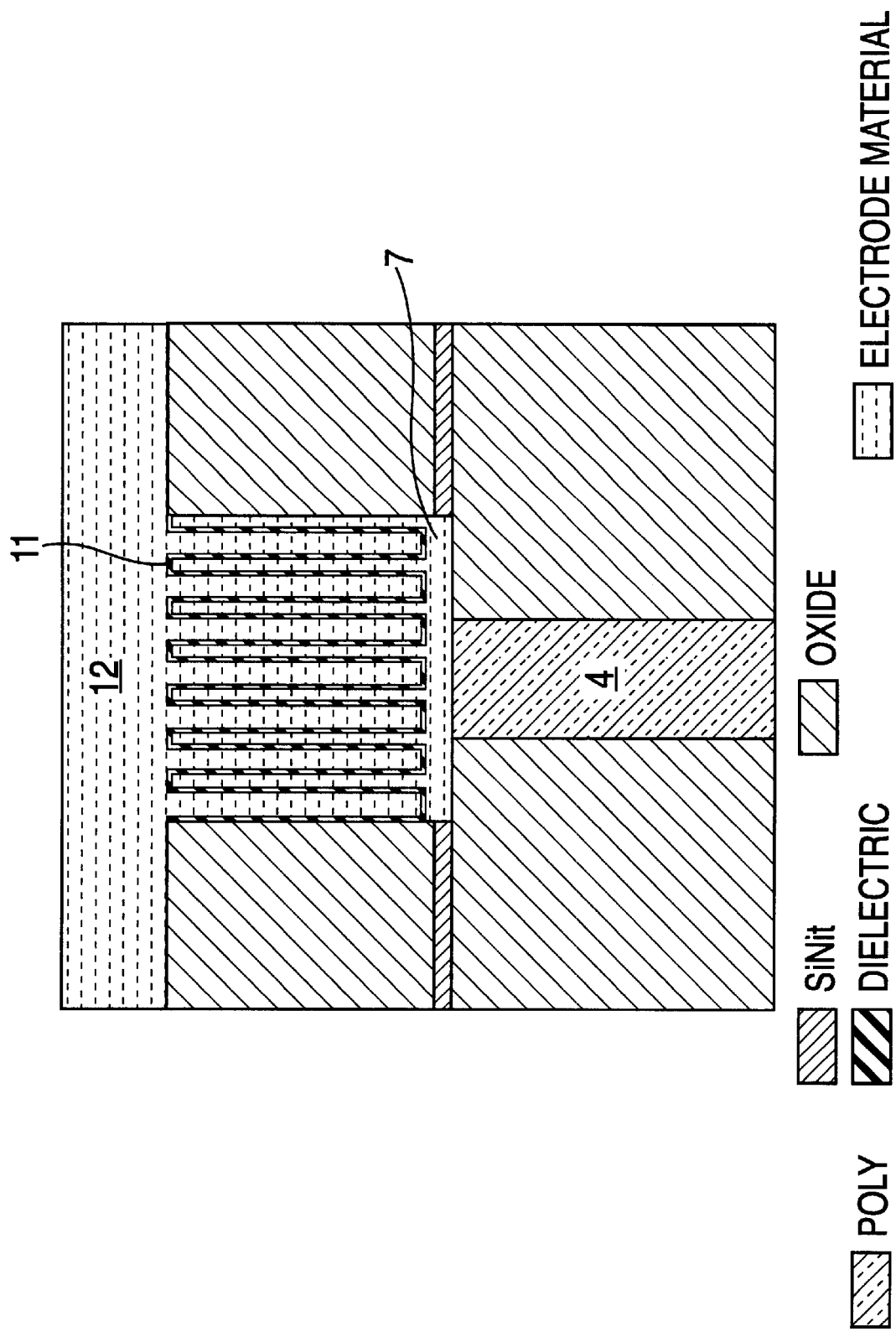
FIG. 8 shows a second electrode pattern deposited upon the dielectric layer of FIG. 7.

Dielectric materials may be deposited onto the electrode 7 by any number of means, such as low density chemical vapor deposition (LDCVD), plasma-enhanced chemical vapor deposition (PECVD), high density plasma chemical vapor deposition (HDP-CVD), and metal oxide chemical vapor deposition (MOCVD), or any other means suited to the particular purpose. Some of these methods may result in dielectric material being deposited directly on the oxide layers 2a as is shown in FIG. 7b. This excess dielectric 11 deposited outside the first electrode 7 and onto the surrounding oxide layers 2a may be trimmed away using standard litho and etch processes. Referring to FIG. 8, a second electrode 12 is formed by depositing electrode material over the dielectric 11, thereby forming a semiconductor capacitor comprising a first electrode 7 and a second electrode 12 separated by a dielectric layer 11.

Figure 9:
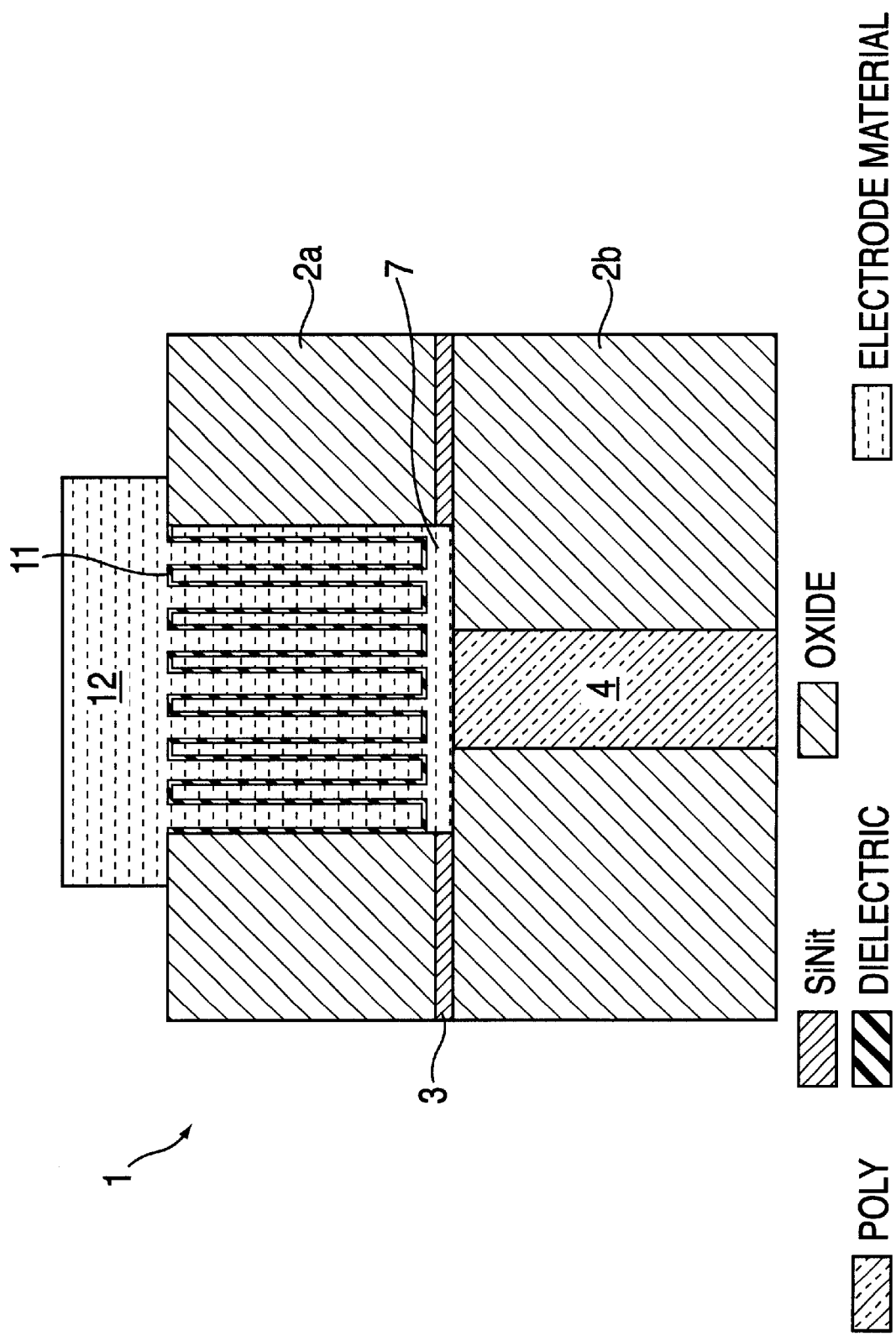
FIG. 9 shows the second electrode pattern of FIG. 8 after final etching.

Referring to FIG. 9, the final step is to etch the second electrode to fit as needed with the rest of the circuit.

Figure 10:
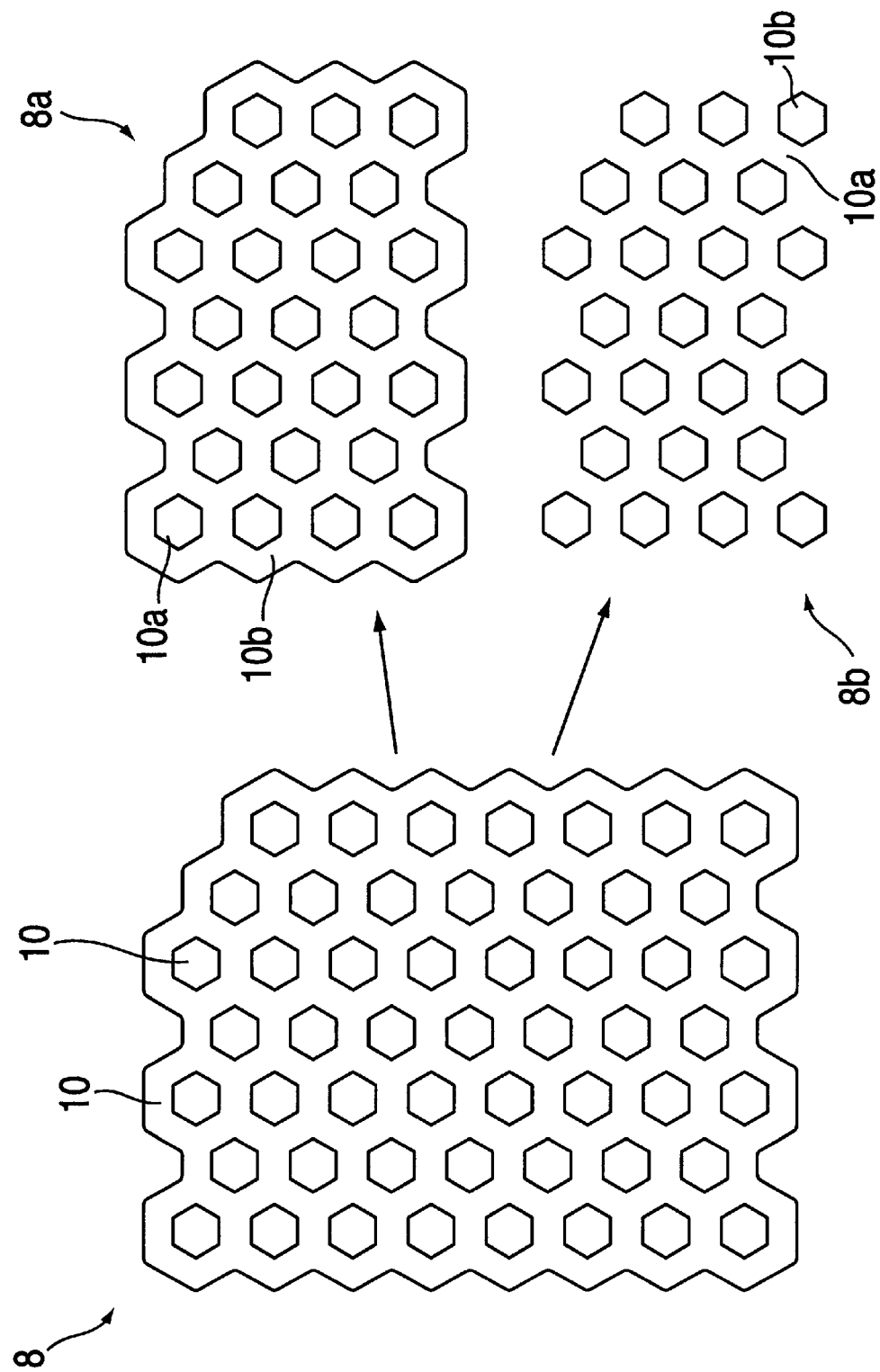
FIG. 10 shows an embodiment of a mask for etching the topographical features of the present invention.

Referring to FIG. 10, there is shown a preferred basic topographic pattern 8 comprising a plane packed with interlocking hexagons. Hexagons are preferred because they pack a planar space uniformly and provide considerable surface area, but not so much surface area as to be difficult to etch. It is preferred that individual topographic features 10 be on the scale of about one order of magnitude smaller than the width or height of the electrode, give or take half an order of magnitude.

Figure 12:
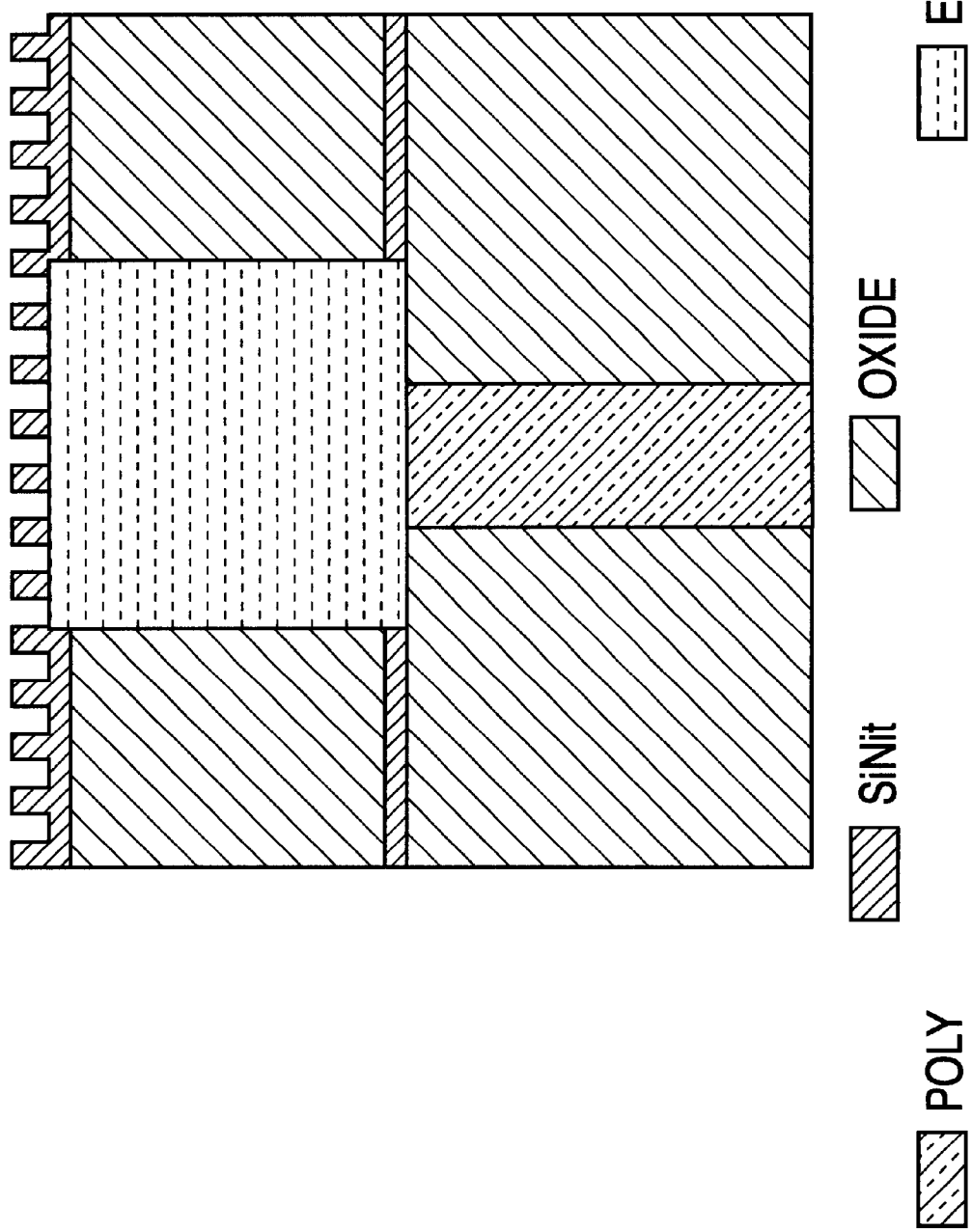
FIGS. 12 through 15 show an alternative embodiment of the invention using an inverted topographical pattern.
Figure 13:
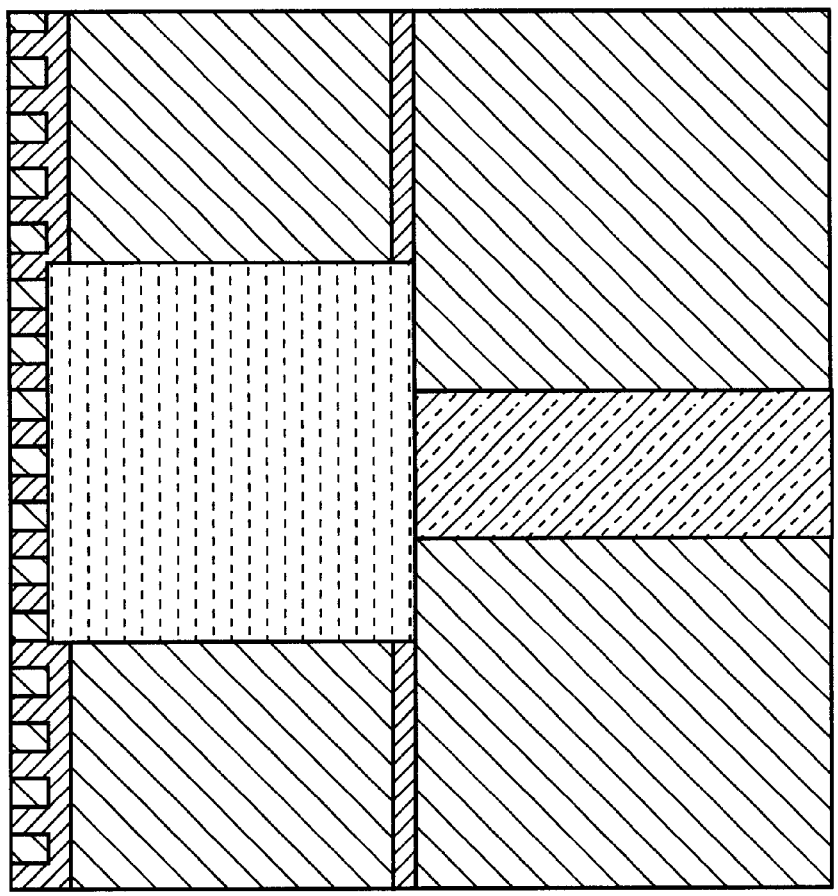
Figure 14:
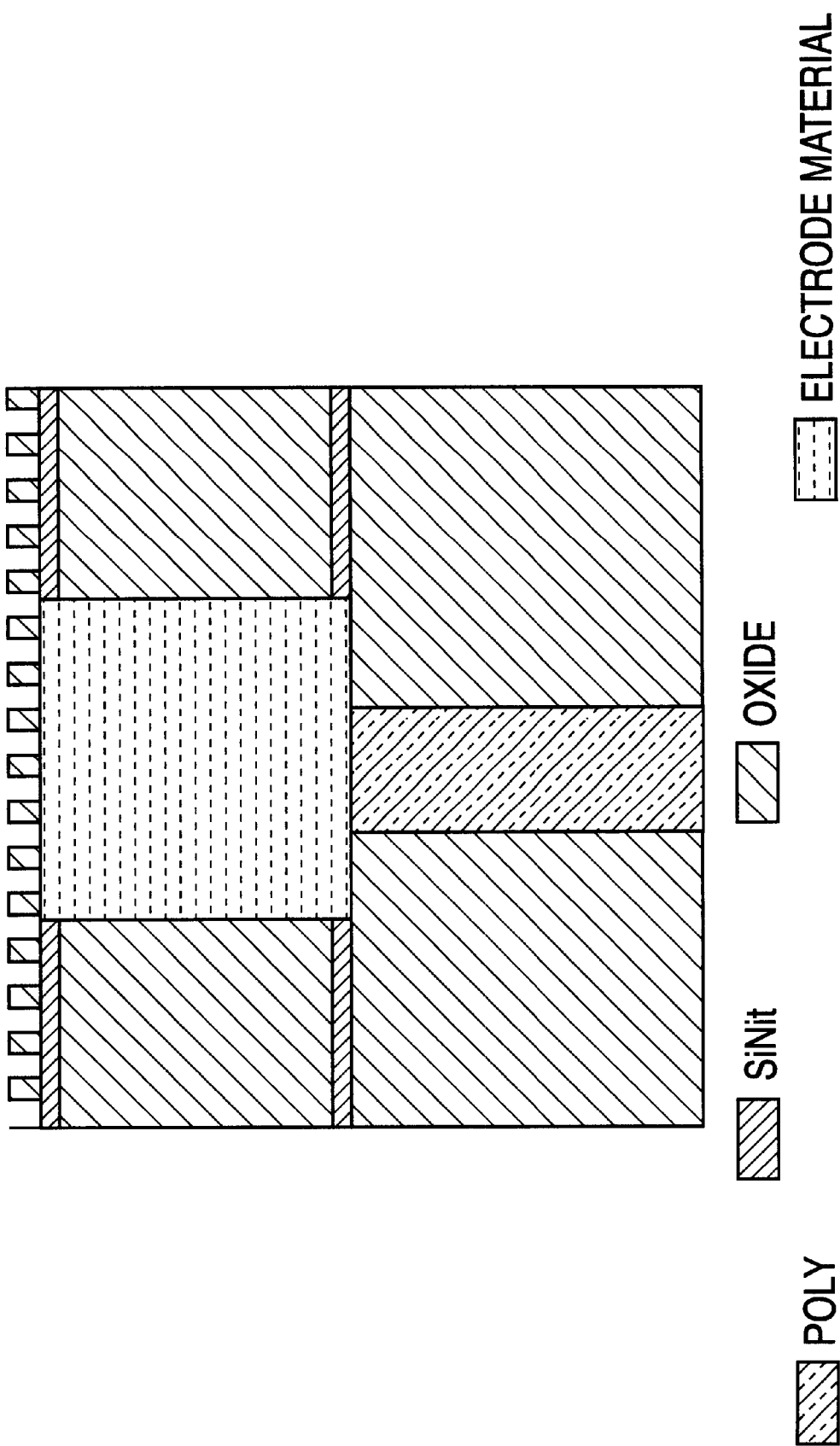
Figure 15:
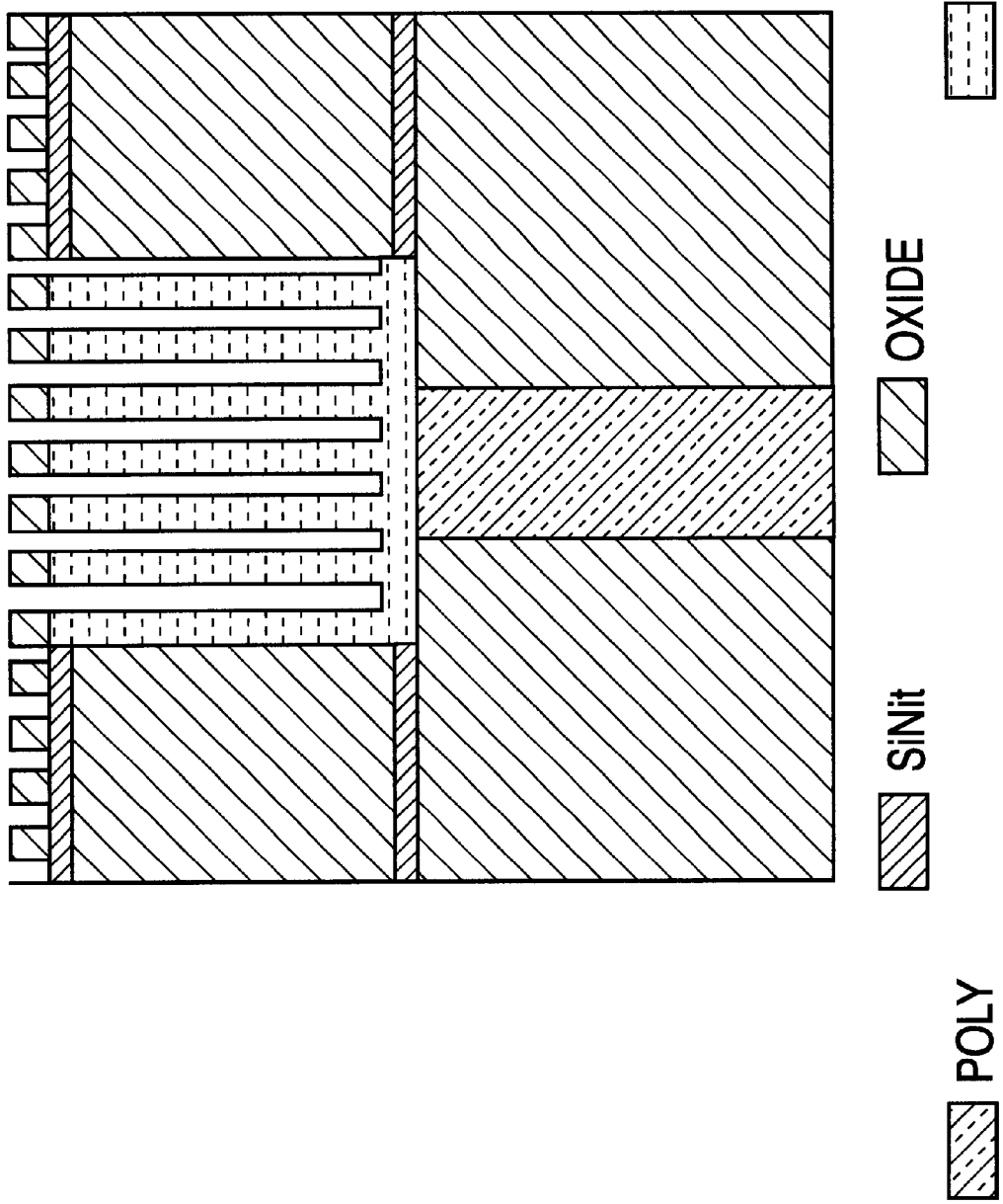

Note that the mask may be used as is, such as to etch a positive topographic pattern 8a having hexagonal pits 10a as already described in FIGS. 1 through 9, or the negative version 8b may be used to etch out the valleys 10a between hexagonal pillars 10b as can be seen in FIGS. 12 through 15. The steps of FIGS. 1 through 5 are identical for each method, therefore FIGS. 1 through 4 are not duplicated and FIG. 5 is exactly duplicated as FIG. 12 for convenient reference. Hence, FIG. 12 shows the transfer of the topographic pattern onto the hard mask, FIG. 13 shows the filling of the nitride hard mask pattern with silicon oxide and planarizing with chemical/mechanical polishing (CMP), FIG. 14 shows the resulting silicon oxide pattern after the silicon nitride hard mask is removed. It is in FIG. 14 that the reversal of the resist pattern occurs—what had been masked areas in FIG. 1 though 9 are now clear and what was clear is now masked. FIG. 15 finishes the transfer of the oxide mask pattern into the storage node conductive material.

Figure 11:
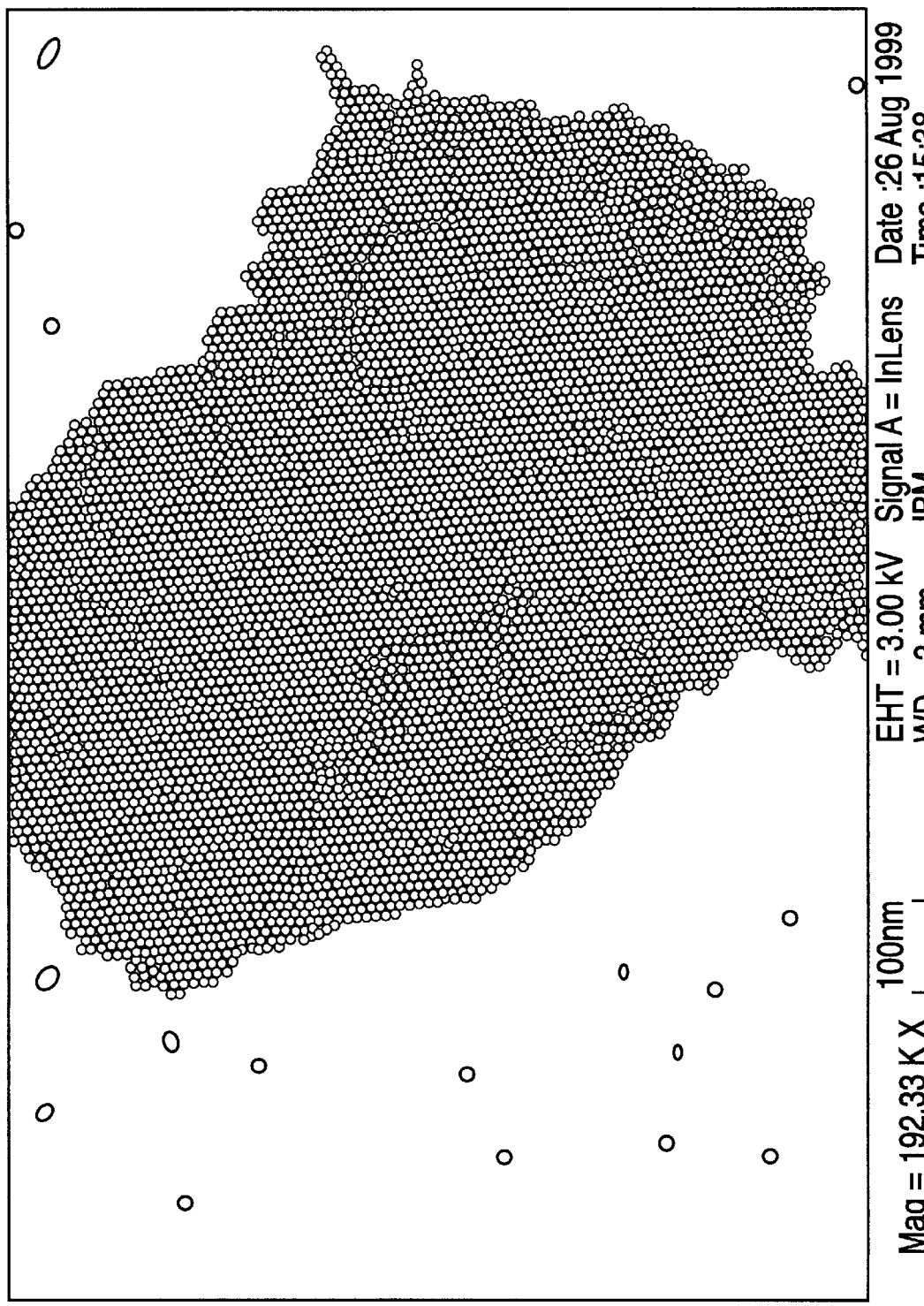
FIG. 11 is derived from an actual scanning electron microscopic image of a mask for etching topographical features into an electrode by the teachings of the invention.

FIG. 11 is a drawing derived from an actual scanning electron microscope image of a positive tone polymer film hexagonal pattern, such as in 8a of FIG. 10, just prior to etching of the pattern into a semiconductor substrate.

A method of making the nanoscale topographic patterns shown in FIGS. 10 and 11 is by using a film of polystyrene-polybutadiene diblock copolymer as a starting material that self-assembles into a hexagonally packed array of polybutadiene (PB) cylinders embedded in a polystyrene (PS) matrix. The PB cylinders are made to orient normal to the plane of the film by, among other known means, spreading a drop of dilute polymer solution in toluene, or like solvent, onto the surface of a de-ionized water bath and allowing the toluene to evaporate. This leaves behind a film typically 100 to 200 nm thick, which may then be deposited upon the surface of the semiconductor. The PB cylinders are then removed by annealing and reaction with ozone, which reacts more rapidly with the PB than with the PS, thereby leaving behind a nanoscale thin film with hexagonally stacked holes typically about 13 nm in diameter, though by controlling the molecular weights of the copolymers one can control the hole size to range from about 2 to about 100 nanometers, such as from about 10 to about 50 nanometers, such as for example from about 10 to about 25 nanometers in diameter and spaced from about 2 to about 100 nanometers apart, such as from about 10 to about 50 nanometers apart, such as for example from about 10 to about 25 nanometers apart, which represent the typical ranges using any of the methods described herein.

A method of inverting the topographic pattern is to treat the film with a blocking stain, usually Osmium, $OsO_4$, which selectively binds to the PB cylinders. This now causes the ozone to attack the PS component at a faster rate than PB, thereby leaving behind a pattern of hexagonally stacked dots instead of holes.

Another method of making topographic patterns is to use a polystyrene-polyisoprene diblock copolymer. This material is similar to the PS-PB copolymer described above, except that the polyisoprene (PI) component self-assembles into spheres instead of cylinders. Hence, there is no need to orient the PI component to the plane of the film. PS-PI films may also be treated with an Osmium stain to create an inverted pattern.

Another method of making the nanoscale topographic patterns of FIGS. 10 and 11 is by using a film of polystyrene-polymethylmethacrylate (PMMA) diblock copolymer as a starting material. The diblock copolymer film can be made to self-assemble into a hexagonally packed array of PMMA cylinders in a polystyrene matrix. The PMMA cylinders can be made to orient normal to the plane of the film by, among other known means, spin-coating a dilute polymer solution in toluene, or other solvent, onto the substrate and annealing the resulting film. The PMMA cylinders are then removed by exposure to electron-beam or ultraviolet radiation and dissolution in acetic acid or other effective solvent. The resulting nanoscale thin film typically has hexagonally packed holes about 20 nanometers in diameter. By controlling the molecular weights and relative ratios of the two polymer blocks, one can control the hole size range from about 2 nanometers up to about 100 nanometers, such as from about 10 to about 50 nanometers, such as from about 10 to about 25 nanometers, and the hole separations from about 2 nanometers up to about 100 nanometers, such as from about 10 to about 50 nanometers, such as from about 10 to about 25 nanometers.

Such methods for creating topographic patterns as described above are set forth in greater detail in Mansky et al., Nanolithographic Templates from Diblock Copolymer Thin Films, *Applied Physics Letters*, vol. 68, pp.2586–2588 (1996); and Park et al., Block Copolymer Lithography: Periodic Arrays of ~10$^{11}$Holes in 1 Square Centimeter, *Science*, vol. 276, May 30, pp. 1401–1404 (1997), the disclosures of both of which are incorporated by reference herein in their entirety.

Other suitable methods for creating and using topographic patterns may be found in Morkved et al., *Science*, v. 273, p. 931 (1998); Morkved et al., *Applied Physics Letters*, v. 64, p. 422 (1994); Mansky et al., *Journal of Material Science*, v. 30, p. 1937 (1995); and Li et al., *Journal of the American Chemical Society*, v. 118, p. 10982 (1996), the disclosures of all four of which are incorporated by reference herein in their entirety.

Alternatively, one may use technologies other than diblock copolymers to make the topographic patterns, such as providing films of inorganic crystals embedded in a coating layer. For example, it is known that SiGe films, when oxidized and then reduced with hydrogen, will undergo reduction of the Germanium and form nanoscale inorganic crystals of Ge embedded in a silicon oxide film, which acts as the coating layer. By selectively etching out the silicon oxide, an array of nanometer scale germanium islands remain on the substrate, thereby increasing surface area. Alternatively, the Germanium could be etched away, thereby leaving a silicon oxide plane pitted with craters where once germanium crystal once stood. The ranges of inorganic crystal diameters will typically be from about 2 to about 100 nanometers, such as from about 10 to about 50 nanometers, such as from about 10 to about 25 nanometers, and spaced from about 2 to about 100 nanometers, such as from about 10 to about 50 nanometers, such as from about 10 to about 25 nanometers apart. Generally the inorganic crystals will have a size distribution of not more than about 20 percent, such as not exceeding about 10 percent, such as for example not more than 5 percent.

In yet another embodiment, nanoscopic particles of Cobalt and the like may be deposited in a liquid solution to form the mask.

It is to be understood that all physical quantities disclosed herein, unless explicitly indicated otherwise, are not to be construed as exactly equal to the quantity disclosed, but rather about equal to the quantity disclosed. Further, the mere absence of a qualifier such as "about, or the like, is not to be construed as an explicit indication that any such disclosed physical quantity is an exact quantity, irrespective of whether such qualifiers are used with respect to any other physical quantities disclosed herein.

While preferred embodiments have been shown and described, various modifications and substitutions may be made thereto without departing from the spirit and scope of the invention. Accordingly, it is to be understood that the present invention has been described by way of illustration only, and such illustrations and embodiments as have been disclosed herein are not to be construed as limiting to the claims.

What is claimed is:

1. A method for forming nanoscale features, comprising:

providing a substrate;

disposing a masking film over the substrate;

disposing a self-forming nanoscale mesh layer over the masking film;

patterning the masking film through the nanoscale mesh for forming a nanoscale mesh mask in a first portion of the masking film, re n portions of said masking film being only partially patterned; and etching the substrate through said first portion of the mask for forming nanoscale features.

2. The method of claim 1 wherein the step of etching the substrate through the mask for forming nanoscale features includes forming a plurality of pillars in the substrate defined by the mesh mask.

3. The method of claim 2 wherein the substrate comprises a first conductor add said method further comprises:

disposing a layer of dielectric on the pillars;

disposing a second conductor on the layer of dielectric for forming a capacitor, a first electrode of the capacitor comprising the first conductor and a second electrode of the capacitor comprising the second conductor.

4. The method of claim 1 wherein said step of disposing said self-forming nanoscale mesh polymer layer comprises:

providing a copolymer film comprising a plurality of polymer blocks;

selectively removing one of said polymer blocks so as to create a topographic pattern.

5. The method of claim 4 wherein said copolymer is a diblock copolymer.

6. The method of claim 5 wherein said copolymer comprises a first component selected from the group consisting of polymethylmethacrylate, polybutadiene, and polyisoprene, and a second component comprised of polystyrene.

7. The method of claim 6 further comprising removing said first component with ultraviolet radiation and dissolution in a solvent.

8. The method of claim 6 further comprising removing said first component with electron-beam radiation and dissolution in a solvent.

9. The method of claim 6 further comprising removing said fist component by annealing and reaction with ozone.

10. The method of claim 4 wherein said copolymer is a triblock copolymer.

11. The method of claim 1 wherein said step of disposing said self-forming nanoscale mesh polymer layer comprises:

providing a SiGe film;

oxidizing and reducing said SiGe film so as to create germanium crystals in a silicon oxide film; and selectively removing one of said germanium crystals or silicon oxide so as to create a topographic pattern.

12. The method of claim 1 wherein said nanoscale features are from about 2 to about 100 nanometers wide and spaced from about 2 to about 100 nanometers apart.

13. The method of claim 1 wherein said nanoscale features are from about 10 to 50 nanometers wide and spaced about 10 to about 50 nanometers apart.

14. The method of claim 1 wherein said step of disposing said self-forming nanoscale mesh polymer layer comprises immersing the substrate in a solution from which said polymer layer deposits on said making film.

15. The method of claim 14 wherein said polymer floats on an upper surface of said solution 16. The method of claim 1 wherein said nanoscale mesh comprises a plurality of hexagon shapes.

17. The method of claim 16 wherein said plurality of hexagon shapes are arranged in an interlocking pattern.

18. The method of claim 1 wherein said first portion of said masking film is thinner than said remaining portions of said masking film.

* * * * *